United States Patent

Clendennen et al.

[15] 3,692,069

[45] Sept. 19, 1972

[54] COMPONENT LEAD FORMING TOOL AND METHOD

[72] Inventors: Leo Clendennen, Garland; Charlie P. Smith, Irving, both of Tex.

[73] Assignee: LTV Electrosystems, Inc., Greenville, Tex.

[22] Filed: Dec. 29, 1970

[21] Appl. No.: 102,400

[52] U.S. Cl. ..................140/106, 72/384, 72/DIG. 10

[51] Int. Cl. ............................B21f 1/00, B21f 45/00

[58] Field of Search ..140/71, 105, 106, 123; 72/384, 72/DIG. 10

[56] References Cited

UNITED STATES PATENTS

| | | | |
|---|---|---|---|
| 3,267,716 | 8/1966 | Hales | 72/384 |
| 3,612,112 | 10/1971 | Siegel et al. | 140/123 |
| 3,360,018 | 12/1967 | Lindsay | 140/123 |
| 3,142,484 | 7/1964 | Press | 269/303 |

*Primary Examiner*—Lowell A. Larson

*Attorney*—James D. Willborn and Richards, Harris & Hubbard

[57] ABSTRACT

A tool and method for forming stress relieving loops in the axial leads of an electrical component. A wedge-shaped component holding block includes generally flat upper and lower surfaces having a plurality of transverse lead receiving grooves formed across the upper and lower surfaces and down the sides. The wedged shape of the block results in side wall grooves which vary in spacing to allow lead formation for different spacing of component mounting holes. A component is placed in a central slot in the block and the leads are first bent downwardly into properly spaced grooves. Then a fulcrum member, pivotally attached to the holder, is placed over the bent leads of the component, and the leads are then bent upwardly about overhanging edges of the fulcrum member to form a stress relieving loop in each of the leads.

5 Claims, 6 Drawing Figures

PATENTED SEP 19 1972

3,692,069

INVENTORS:
LEO CLENDENNEN
CHARLIE P. SMITH

Richards, Harris & Hubbard
ATTORNEYS

COMPONENT LEAD FORMING TOOL AND METHOD

BACKGROUND OF THE INVENTION

1. Field of the Invention

The invention relates to a tool and method for forming component leads, and more particularly, to a tool and method for forming a stress relieving loop in an axial lead of a component.

2. History of the Prior Art

When axially leaded components are mounted within preformed holes in a printed circuit board, the leads must be bent at right angles to the axis of the component before the component is inserted and soldered into place. For certain components, however, such as glass diodes, extra caution must be taken because the thermal stresses generated within the glass during operation often result in fracture of the diode body because the leads are held rigidly in the mounting holes. For such components it is necessary to form a thermal stress relieving loop between the component body and at least one of the perpendicular leads before mounting them on the board.

Prior art component forming tools have consisted principally of a wedge-shaped block having lead forming grooves down the edge so that a groove having a desired spacing can be selected to fit certain spaced holes. With prior art tools, a stress relieving loop must be placed in the lead by manually shaping the lead with a pair of needlenose pliars after the leads are bent. The tool of the present invention overcomes the difficulties of the prior art by forming a stress relieving loop in the component leads at the same time they are bent at right angles to the component body.

SUMMARY OF THE INVENTION

A tool and method for bending the leads of electrical components to form a stress relieving loop therein. The tool includes a block having a central slot for receiving the body of an axially leaded component. The block has edge sections about which the component leads may be first bent at right angles to the body. A fulcrum member is adapted for engagement with the block and includes a pair of spaced lip sections which overhang the leads of a component having been bent about the edges of the block. The edges act as pivot points to bend the leads of the component away from the block edges and then perpendicular to the component axis to form a stress relieving loop about the edges of the lip sections.

The method includes supporting the component with the lead to be formed extending across a forming edge and first bending the lead at right angles to the component body. A lip is then positioned adjacent the lead and below the edge and the lead is bent about the lip in the opposite direction from the first bend into a position at right angle to the component body to form a stress relieving loop in the lead.

DESCRIPTION OF THE DRAWING

For a more complete understanding of the present invention and for further objects and advantages thereof, reference may now be had to the following description taken in conjunction with the accompanying drawing in which.

DETAILED DESCRIPTION

Figure 1:
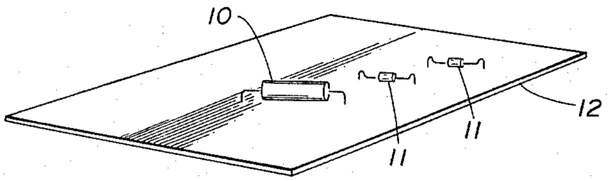
FIG. 1 is a perspective view of a printed circuit board having several components mounted thereon.

As shown in FIG. 1, axially leaded components 10 and 11 are generally mounted onto a printed circuit board 12 by means of hole pairs formed through the board. The hole pairs are formed a preselected spaced distance apart to conform to both the size of the component being mounted and the printed circuit pattern connection points on the underside of the board. For most components, such as carbon resistor 10, the leads are bent at right angles to the axis of the component so that the distances between the leads is the same as that between the holes into which the component is to be received. Other components, however, cannot be mounted in this manner. For example, each of the diodes 11 has a body section which is formed from glass. During circuit operation a substantial amount of heat is often generated in the glass body of the diode 11 and if it is mounted with simple perpendicular leads, such as the resistor 10, axial thermal stresses are generated in the body. If the stresses cannot be relieved because of the rigidity of the leads and their fixation to the printed circuit board, cracks in the glass body will occur and result in destruction of the electrical function of the diode. For components such as the glass diodes 11, it is necessary to produce a stress relieving loop in the leads of the diodes as they are formed at right angles to the body. Such loops allow for an adequate amount of thermal expansion of the body and prevent fracture.

Figures 2, 3:
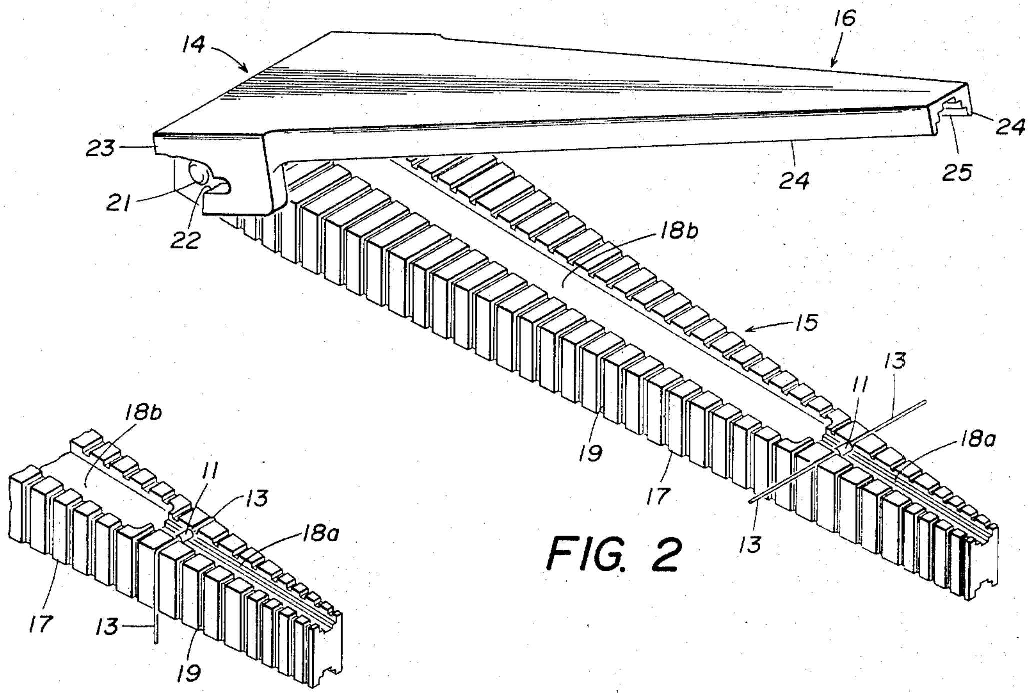
FIG. 2 is a perspective view of the component lead forming tool of the present invention with the fulcrum member in a raised position.
FIG. 3 is a perspective view of a portion of the lead forming tool shown in FIG. 2 illustrating the first step in component lead formation.

FIG. 2 illustrates a perspective view of the component lead forming tool 14 of the invention which rapidly and easily forms component leads so that a stress relieving loop is produced between the body and the end of the leads at the same time the leads are formed at right angles to the body.

The tool 14 comprises two separable portions, a wedge shaped holder portion 15 and a fulcrum member 16. The holder 15 is preferably formed from a plastic material and comprises an elongated wedge shaped block 17 having a rectangular cross-section which decreases in width from the back portion of the block toward the front. The block 17 has a generally flat upper and lower surface and the thickness of the block is constant over its entire length except for a plurality of centrally disposed component receiving slots 18A and 18B formed along both the upper and lower surfaces. A plurality of lead receiving grooves 19 extend transversely across the upper and lower surfaces and down along the forming edges of the block to join the slots on opposite sides. The different width slots are used to receive different sizes of component bodies. For example, the slot 18A near the forward end of the block 17 is adapted for one quarter watt resistors or diodes while the width of the slot 18B is appropriate for 1 watt resistors. Similar slots are formed on the lower surface of the block 17 and may be adapted to receive components of different sizes. The slots on the opposite side from 18A and 18B will receive diodes or ⅛-watt resistors forward or ½-watt resistors toward the rear. The grooves 19 are of sufficient width to loosely receive the largest diameter component lead which is to be formed. The block is wedge shaped so that there are various spacings of groove pairs to allow component leads to be formed for various spacings of component mounting holes. If desired, numbering can be added to the surface of the block to aid an operator in selecting the proper spacing of grooves for a particular mounting hole pair.

The fulcrum member 16, also preferably made of plastic, is attached to the rear section of the block 17 by means of a pair of spring biased detents 21 mounted within the body of the block. The detents 21 are received in a pair of elongated slots 22 formed in downward extending projections 23. The spring biased detents 21 allow the fulcrum member 16 to be attached for engagement with either side of the block 17. The fulcrum member 16 includes a pair of overhanging lip sections 24 which define a component receiving channel 25 therebetween.

Figure 4:
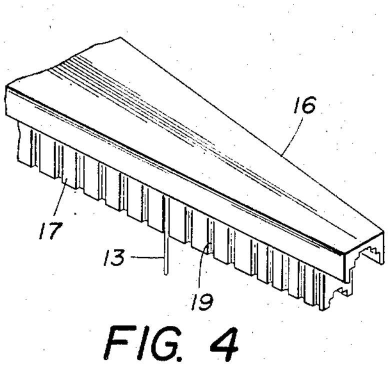
FIG. 4 is a perspective view of a portion of the component lead forming tool of FIG. 2 with the fulcrum member in a closed position illustrating the second step in lead formation.
Figure 5:
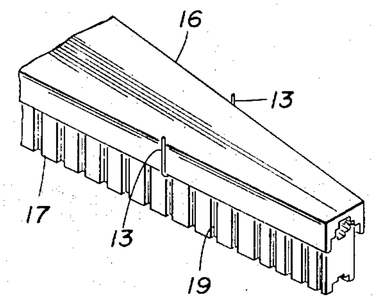
FIG. 5 is a perspective view of the tool of FIG. 2 illustrating the third and final step in lead formation.

A component is formed with leads having stress receiving loops therein in the manner sequentially illustrated in FIGS. 3, 4, and 5. First the component 11 is placed within the proper sized slot 18 to accommodate the body of the component with component leads in alignment with the properly spaced grooves 19 to produce shaped leads corresponding to the mounting holes into which the component is to be placed.

With the fulcrum member 16 of the tool in a raised position, the leads 13 of the component 11 are bent downwardly across the forming edges into the grooves 19.

As shown in FIG. 4, the fulcrum member 16 is lowered to cover the component 11 and receive the body into the channel 25. The overhanging lips 24 of the fulcrum member extend down over and cover the leads 13 of the component 11. To insure a snug fit of the lips 24 against the leads 13, the fulcrum member 16 is moved forwardly before closing to move the detents 21 toward the rear section of the slots 22 and give a small space between the lips 24 and the leads 13. The fulcrum member 16 is then lowered into position and the member is then moved rearwardly to move the detents 21 toward the front portion of the slots 22 and bring the overhanging lips 24 of the member into snug engagement with the sides of the block 17 tightly enclosing the leads 13 of the component within the grooves 19.

Figure 6:
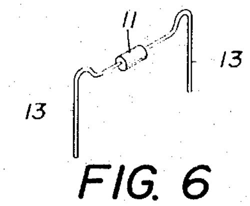
FIG. 6 shows a glass diode with leads having stress relieving loops as formed by the tool of the present invention.

The final step in formation of the stress relieving leads is shown in FIG. 5. The leads 13 are bent upwardly from within the grooves 19 around the overhanging lip portions 24 to extend perpendicular to the body of the component 11. Since the lips 24 extend below the surface of the block 17 when the member 16 is closed, bending the leads upward shapes the stress relieving loop upward in each lead as it is bent around the edges of the lips. After bending, the fulcrum member 16 is then raised and the component is removed. A finished component having leads with stress relieving loops formed with the tool of the present invention is shown in FIG. 6.

It is to be understood that, if desired, only one stress relieving loop could be formed in a component lead by slight modification of the above described tool and method. Further, the method disclosed may be readily adapted for automated lead formation and insertion machinery. The method may be used to form either one or both of the leads with stress relieving loops therein.

Having described the invention in connection with certain specific embodiments thereof, it is to be understood that further modifications may now suggest themselves to those skilled in the art and it is intended to cover such modifications as fall within the scope of the appended claims.

What is claimed is:

1. A tool for bending a lead of an electrical component to form a stress relieving loop therein comprising:

a wedge-shaped block having a central slot therein for receiving the body of a component having axial leads, said block having side walls which vary in spacing from one another to form a pair of bent component leads corresponding to various spacings of component mounting holes, said block further including a pair of detents near the wide end of the wedge which extend outwardly from opposite sides of the block; and a wedge-shaped fulcrum member adapted for engagement with said wedge-shaped block and having a spaced lip section which overhangs and engages the lead of a component having been bent about the edge of said block, said lip acting as a pivot point to bend the lead of the component away from the block edge and then perpendicular to the component axis to form a stress releiving loop about said lip section, said wedge-shaped fulcrum further including downwardly extending projections near the wide end having longitudinally extending slots therein for engagement with the detents to permit longitudinal movement of said fulcrum member with respect to said block member when said member overlies said block and insure a snug engagement of the overhanging lip section with the side wall of said block.

2. A tool for bending the leads of electrical components as set forth in claim 1 wherein said block includes component receiving slots on both sides and wherein said detents are spring biased outwardly to allow pivotal attachment of said fulcrum member to either side of said block.

3. A tool for bending the levels of an axially leaded electrical component to form a thermal stress relieving loop therein comprising:

a wedge-shaped block having a generally flat upper and lower surface and perpendicular side walls, said block including a central component receiving slot in the upper and lower surfaces, a plurality of lead receiving grooves transversely extending from said slots across the upper and lower surfaces and down the side walls, and a pair of spring biased detents mounted in the side walls near the wider end; and a wedge-shaped fulcrum member which includes downwardly extending projections near the wide end having longitudinally extending slots formed therein for engagement with the detents in said block to removably and pivotally attach said fulcrum member to said block, and downwardly extending lip sections along the edges of said member which overhang and engage the side walls of said block when said fulcrum member is pivoted closed to overlie said block.

4. A tool for bending the leads of a component to form a stress relieving loop therein of the type which includes a wedge-shaped block having a central slot therein for receiving the body of a component having axial leads, and which has side walls about which component leads may be first bent at right angles to the component body, and said block further including a pair of detents near the wide end of the wedge which extend outwardly from opposite sides of the block, wherein the improvement comprises:

a wedge-shaped fulcrum member including downwardly extending projections near the wide end having longitudinally extending slots therein for engagement with the detents to pivotally attach said fulcrum member to said block to permit longitudinal movement of the fulcrum member with respect to the block when said member overlies said block and insure a snug engagement of the overhanging lip section of the fulcrum with the edge section of the block, said fulcrum member adapted for engagement with said block and engaging the leads of a component having been bent about the edges of said slot, said lip sections acting as pivot points to bend the leads of the component away from the block edges and then perpendicular to the component axis to form a stress relieving loop about the edges of the lip section.

5. A tool for bending the leads of electrical components as set forth in claim 4 wherein said block includes component receiving slots on both sides and wherein said detents are spring biased outwardly to allow pivotal attachment of said fulcrum member to either side of said block.

* * * * *